US009929457B2

(12) United States Patent
Alkan et al.

(10) Patent No.: US 9,929,457 B2
(45) Date of Patent: Mar. 27, 2018

(54) RADIO FREQUENCY SIGNAL SPLITTER

(71) Applicant: PPC BROADBAND, INC., East Syracuse, NY (US)

(72) Inventors: Erdogan Alkan, Manlius, NY (US); Leon Marketos, Aubrun, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 15/582,934

(22) Filed: May 1, 2017

(65) Prior Publication Data

US 2017/0237141 A1    Aug. 17, 2017

Related U.S. Application Data

(63) Continuation of application No. 14/989,062, filed on Jan. 6, 2016, now Pat. No. 9,641,147, which is a
(Continued)

(51) Int. Cl.
*H01P 5/19* (2006.01)
*H03H 7/06* (2006.01)
*H03H 7/48* (2006.01)

(52) U.S. Cl.
CPC ............. *H01P 5/19* (2013.01); *H03H 7/06* (2013.01); *H03H 7/48* (2013.01)

(58) Field of Classification Search
CPC .......... H03H 7/0138; H03H 7/06; H03H 7/46; H03H 7/48
(Continued)

(56) References Cited

U.S. PATENT DOCUMENTS 3,790,909 A    2/1974  LeFevre
3,845,358 A   10/1974  Anderson et al.
(Continued)

FOREIGN PATENT DOCUMENTS

JP    55-080989 A    6/1980
JP    55-132126 A   10/1980
(Continued)

OTHER PUBLICATIONS

Wells, "Cable Television Entry Adapter", U.S. Appl. No. 13/245,510, filed Sep. 26, 2011.
(Continued)

*Primary Examiner* — Brandon S Cole
(74) *Attorney, Agent, or Firm* — MH2 Technology Law Group, LLP

(57) ABSTRACT

Disclosed is a signal splitter that includes a coupled transmission line element coupled between two output ports of the signal splitter. The coupled transmission line element is used to lower the isolation between the two output ports for a particular frequency band. The coupled transmission line element includes a first and a second elongate electrical conductor. The first and the second elongate electrical conductor first ends are coupled to the signal transmission path that connects the two output ports. The first and the second elongate electrical conductor second ends are un-terminated. The first elongate electrical conductor and the second elongate electrical conductor are not shorted together, and the first elongate electrical conductor and the second elongate electrical conductor are electrostatically coupled, such as by twisting them together into a helix.

19 Claims, 9 Drawing Sheets

Related U.S. Application Data continuation of application No. 13/920,423, filed on Jun. 18, 2013, now Pat. No. 9,264,012.

(60) Provisional application No. 61/663,953, filed on Jun. 25, 2012.

(58) Field of Classification Search
USPC .................................................. 333/100–137
See application file for complete search history.

(56) References Cited

U.S. PATENT DOCUMENTS

| | | | |
|---|---|---|---|
| 3,939,431 A | 2/1976 | Cohlman | |
| 4,027,219 A | 5/1977 | Van Alphen et al. | |
| 4,281,293 A * | 7/1981 | Childs | H04L 27/22 |
| | | | 329/305 |
| 4,306,403 A | 12/1981 | Hubbard et al. | |
| 4,344,499 A | 8/1982 | Van der Lely et al. | |
| 4,399,419 A | 8/1983 | Dobrovolny | |
| 4,512,033 A | 4/1985 | Schrock | |
| 4,520,508 A | 5/1985 | Reichert, Jr. | |
| 4,648,123 A | 3/1987 | Schrock | |
| 4,677,390 A | 6/1987 | Wagner | |
| 4,715,012 A | 12/1987 | Mueller, Jr. | |
| 4,961,218 A | 10/1990 | Kiko | |
| 4,982,440 A | 1/1991 | Dufresne et al. | |
| 5,010,399 A | 4/1991 | Goodman et al. | |
| 5,126,840 A | 6/1992 | Dufresne et al. | |
| 5,214,505 A | 5/1993 | Rabowsky et al. | |
| 5,231,660 A | 7/1993 | West, Jr. | |
| 5,334,955 A | 8/1994 | Strnad | |
| 5,369,642 A | 11/1994 | Shioka et al. | |
| 5,485,630 A | 1/1996 | Lee et al. | |
| 5,534,830 A | 7/1996 | Ralph | |
| 5,548,255 A | 8/1996 | Spielman | |
| 5,557,319 A | 9/1996 | Gurusami et al. | |
| 5,557,510 A | 9/1996 | McIntyre et al. | |
| 5,659,273 A | 8/1997 | Harpham | |
| 5,668,510 A | 9/1997 | Humpherys | |
| 5,719,792 A | 2/1998 | Bush | |
| 5,740,044 A | 4/1998 | Ehrenhardt et al. | |
| 5,745,836 A | 4/1998 | Williams | |
| 5,798,902 A | 8/1998 | Blodgett et al. | |
| 5,815,794 A | 9/1998 | Williams | |
| 5,818,825 A | 10/1998 | Corrigan et al. | |
| 5,839,052 A | 11/1998 | Dean et al. | |
| 5,893,024 A | 4/1999 | Sanders et al. | |
| 5,937,330 A | 8/1999 | Vince et al. | |
| 5,950,111 A | 9/1999 | Georger et al. | |
| 5,970,053 A | 10/1999 | Schick et al. | |
| 6,005,442 A * | 12/1999 | Maeda | H03F 3/604 |
| | | | 330/295 |
| 6,012,271 A | 1/2000 | Wilkens et al. | |
| 6,014,547 A | 1/2000 | Caporizzo et al. | |
| 6,049,693 A | 4/2000 | Baran et al. | |
| 6,069,960 A | 5/2000 | Mizukami et al. | |
| 6,094,211 A | 7/2000 | Baran et al. | |
| 6,101,932 A | 8/2000 | Wilkens | |
| 6,128,040 A | 10/2000 | Shinbori et al. | |
| 6,129,187 A | 10/2000 | Bellanger et al. | |
| 6,169,569 B1 | 1/2001 | Widmer et al. | |
| 6,173,225 B1 | 1/2001 | Stelzle et al. | |
| 6,185,432 B1 | 2/2001 | Vembu | |
| 6,205,138 B1 | 3/2001 | Nihal et al. | |
| 6,348,837 B1 | 2/2002 | Ibelings | |
| 6,348,955 B1 | 2/2002 | Tait | |
| 6,373,349 B2 | 4/2002 | Gilbert | |
| 6,377,316 B1 | 4/2002 | Mycynek et al. | |
| 6,388,539 B1 | 5/2002 | Rice | |
| 6,425,132 B1 | 7/2002 | Chappell | |
| 6,430,904 B1 | 8/2002 | Coers et al. | |
| 6,495,998 B1 | 12/2002 | Terreault | |
| 6,498,925 B1 | 12/2002 | Tauchi | |
| 6,510,152 B1 | 1/2003 | Gerszberg et al. | |
| 6,546,705 B2 | 4/2003 | Scarlett et al. | |
| D475,019 S | 5/2003 | Soulodre | |
| D475,020 S | 5/2003 | Soulodre | |
| 6,560,778 B1 | 5/2003 | Hasegawa | |
| 6,570,928 B1 | 5/2003 | Shibata | |
| D475,350 S | 6/2003 | Soulodre | |
| 6,587,012 B1 | 7/2003 | Farmer et al. | |
| 6,594,827 B1 | 7/2003 | Pennings | |
| 6,622,304 B1 | 9/2003 | Carhart | |
| 6,640,338 B1 | 10/2003 | Shibata | |
| 6,678,893 B1 | 1/2004 | Jung | |
| 6,683,513 B2 | 1/2004 | Shamsaifar et al. | |
| 6,725,462 B1 | 4/2004 | Kaplan | |
| 6,728,968 B1 | 4/2004 | Abe et al. | |
| 6,757,910 B1 | 6/2004 | Bianu | |
| 6,758,292 B2 | 7/2004 | Shoemaker | |
| 6,804,828 B1 | 10/2004 | Shibata | |
| 6,843,044 B2 | 1/2005 | Clauss | |
| 6,845,232 B2 | 1/2005 | Darabi | |
| 6,868,552 B1 | 3/2005 | Masuda et al. | |
| 6,877,166 B1 | 4/2005 | Roeck et al. | |
| 6,915,530 B1 | 7/2005 | Kauffman et al. | |
| 6,920,614 B1 | 7/2005 | Schindler et al. | |
| 6,928,175 B1 | 8/2005 | Bader et al. | |
| 6,942,595 B2 | 9/2005 | Hrazdera | |
| 7,003,275 B1 | 2/2006 | Petrovic | |
| 7,012,496 B2 | 3/2006 | Sugiura et al. | |
| 7,029,293 B2 | 4/2006 | Shapson et al. | |
| 7,039,432 B2 | 5/2006 | Strater et al. | |
| 7,048,106 B2 | 5/2006 | Hou | |
| 7,061,355 B2 | 6/2006 | Tanaka et al. | |
| 7,127,734 B1 | 10/2006 | Amit | |
| 7,162,731 B2 | 1/2007 | Reidhead et al. | |
| 7,254,827 B1 | 8/2007 | Terreault | |
| 7,283,479 B2 | 10/2007 | Ljungdahl et al. | |
| 7,399,255 B1 | 7/2008 | Johnson et al. | |
| 7,404,355 B2 | 7/2008 | Viaud et al. | |
| 7,404,738 B2 | 7/2008 | Montena | |
| 7,416,068 B2 | 8/2008 | Ray et al. | |
| 7,454,252 B2 | 11/2008 | El-Sayed | |
| 7,464,526 B2 | 12/2008 | Coenen | |
| 7,505,819 B2 | 3/2009 | El-Sayed | |
| 7,530,091 B2 | 5/2009 | Vaughan | |
| 7,549,157 B1 | 6/2009 | Jackson et al. | |
| D596,131 S | 7/2009 | Soulodre | |
| 7,675,381 B2 | 3/2010 | Lin | |
| 7,742,777 B2 | 6/2010 | Strater et al. | |
| 8,082,570 B2 | 12/2011 | Olson et al. | |
| 8,098,113 B2 | 1/2012 | Alkan | |
| 8,106,660 B1 | 1/2012 | Merewether et al. | |
| 8,149,070 B2 | 4/2012 | Albag et al. | |
| 8,181,211 B2 | 5/2012 | Olson et al. | |
| 8,286,209 B2 | 10/2012 | Egan et al. | |
| 8,350,641 B2 | 1/2013 | Alkan et al. | |
| 8,356,322 B2 | 1/2013 | Wells et al. | |
| 8,429,695 B2 | 4/2013 | Halik et al. | |
| 8,479,247 B2 | 7/2013 | Shafer | |
| 8,510,782 B2 | 8/2013 | Wells et al. | |
| 8,589,997 B2 | 11/2013 | Wells | |
| 8,935,543 B2 * | 1/2015 | Hunter, Jr. | H04L 12/10 |
| | | | 307/18 |
| 9,203,628 B2 * | 12/2015 | Hunter, Jr. | H04L 12/10 |
| 9,373,879 B2 * | 6/2016 | Ehyaie | H01P 5/16 |
| 2001/0016950 A1 | 8/2001 | Matsuura | |
| 2001/0050605 A1 | 12/2001 | Sugiura et al. | |
| 2002/0141347 A1 | 10/2002 | Harp et al. | |
| 2002/0144292 A1 | 10/2002 | Uemura et al. | |
| 2002/0166124 A1 | 11/2002 | Gurantz et al. | |
| 2002/0174423 A1 | 11/2002 | Fifield et al. | |
| 2003/0084458 A1 | 5/2003 | Ljungdahl et al. | |
| 2004/0113742 A1 | 6/2004 | Tanaka et al. | |
| 2004/0147273 A1 | 7/2004 | Morphy | |
| 2004/0172659 A1 | 9/2004 | Ljungdahl et al. | |
| 2004/0229561 A1 | 11/2004 | Cowley et al. | |
| 2004/0244053 A1 | 12/2004 | Golombek | |
| 2004/0263283 A1 | 12/2004 | Ji | |
| 2005/0034168 A1 | 2/2005 | Beveridge | |
| 2005/0047051 A1 | 3/2005 | Marland | |
| 2005/0144649 A1 | 6/2005 | Bertonis et al. | |
| 2005/0181300 A1 | 8/2005 | Okazaki et al. | |

(56) References Cited

U.S. PATENT DOCUMENTS

| | | | |
|---|---|---|---|
| 2005/0283815 | A1 | 12/2005 | Brooks et al. |
| 2005/0289632 | A1 | 12/2005 | Brooks et al. |
| 2006/0015921 | A1 | 1/2006 | Vaughan |
| 2006/0041918 | A9 | 2/2006 | Currivan et al. |
| 2006/0100799 | A1* | 5/2006 | Karam ............... G06F 1/26 702/57 |
| 2006/0191359 | A1 | 8/2006 | Tarasinski et al. |
| 2006/0205442 | A1 | 9/2006 | Phillips et al. |
| 2006/0241838 | A1 | 10/2006 | Mongiardo et al. |
| 2006/0250197 | A1 | 11/2006 | Petrovic |
| 2006/0282871 | A1 | 12/2006 | Yo |
| 2007/0076746 | A1 | 4/2007 | Faska et al. |
| 2007/0288981 | A1 | 12/2007 | Mitsuse et al. |
| 2007/0288982 | A1 | 12/2007 | Donahue |
| 2008/0012658 | A1 | 1/2008 | Fortier |
| 2008/0014790 | A1 | 1/2008 | Montena |
| 2008/0022344 | A1 | 1/2008 | Riggsby |
| 2008/0040764 | A1 | 2/2008 | Weinstein et al. |
| 2008/0120667 | A1 | 5/2008 | Zaltsman |
| 2008/0127287 | A1 | 5/2008 | Alkan et al. |
| 2008/0204172 | A1 | 8/2008 | Sakai et al. |
| 2008/0235750 | A1 | 9/2008 | Urbanek et al. |
| 2008/0247401 | A1 | 10/2008 | Bhal et al. |
| 2008/0247541 | A1 | 10/2008 | Cholas et al. |
| 2008/0271094 | A1 | 10/2008 | Kliger et al. |
| 2008/0313691 | A1 | 12/2008 | Cholas et al. |
| 2009/0002246 | A1 | 1/2009 | Rabinovich et al. |
| 2009/0031391 | A1 | 1/2009 | Urbanek |
| 2009/0047917 | A1 | 2/2009 | Phillips et al. |
| 2009/0077608 | A1 | 3/2009 | Romerein et al. |
| 2009/0113510 | A1 | 4/2009 | Knutson et al. |
| 2009/0165070 | A1 | 6/2009 | McMullin et al. |
| 2009/0180782 | A1 | 7/2009 | Bernard et al. |
| 2009/0320086 | A1 | 12/2009 | Rijssemus et al. |
| 2010/0017842 | A1 | 1/2010 | Wells |
| 2010/0079218 | A1 | 4/2010 | Albag et al. |
| 2010/0095344 | A1 | 4/2010 | Newby et al. |
| 2010/0100918 | A1 | 4/2010 | Egan, Jr. et al. |
| 2010/0125877 | A1 | 5/2010 | Wells et al. |
| 2010/0146564 | A1 | 6/2010 | Halik et al. |
| 2010/0225813 | A1 | 9/2010 | Hirono et al. |
| 2010/0244980 | A1 | 9/2010 | Olson et al. |
| 2010/0251314 | A1 | 9/2010 | Olson et al. |
| 2010/0251323 | A1 | 9/2010 | Jackson |
| 2010/0301972 | A1 | 12/2010 | Alkan |
| 2011/0025430 | A1* | 2/2011 | Ellingboe ............... H01P 5/183 333/124 |
| 2011/0072472 | A1 | 3/2011 | Wells et al. |
| 2011/0181371 | A1 | 7/2011 | Alkan et al. |
| 2011/0187481 | A1 | 8/2011 | Alkan et al. |
| 2011/0258677 | A1 | 10/2011 | Shafer |
| 2012/0054805 | A1 | 3/2012 | Shafer et al. |
| 2012/0054819 | A1 | 3/2012 | Alkan et al. |
| 2012/0159556 | A1 | 6/2012 | Alkan |
| 2012/0274414 | A1 | 11/2012 | Hung |
| 2013/0081096 | A1 | 3/2013 | Wells et al. |
| 2013/0091533 | A1 | 4/2013 | Wells et al. |
| 2013/0125193 | A1 | 5/2013 | Wells |
| 2013/0133019 | A1 | 5/2013 | Montena et al. |
| 2013/0196539 | A1 | 8/2013 | Shafer et al. |
| 2013/0227632 | A1 | 8/2013 | Wells et al. |
| 2013/0278353 | A1 | 10/2013 | Alkan et al. |
| 2013/0342281 | A1 | 12/2013 | Alkan et al. |
| 2014/0033264 | A1 | 1/2014 | Li et al. |
| 2014/0043104 | A1* | 2/2014 | Chen ............... G06F 1/10 331/46 |

FOREIGN PATENT DOCUMENTS

| | | |
|---|---|---|
| JP | 57-091055 A | 6/1982 |
| JP | 58101582 A | 6/1983 |
| JP | 5899913 | 7/1983 |
| JP | 61157035 A | 7/1986 |
| JP | 59026709 | 8/1987 |
| JP | 05-191416 A | 7/1993 |
| JP | 07-038580 A | 2/1995 |
| JP | 11-069334 A | 3/1999 |
| JP | 2001-177580 A | 6/2001 |
| JP | 2004-080483 | 3/2004 |
| JP | 2005-005875 | 1/2005 |
| JP | 2007-166109 A | 6/2007 |
| JP | 2007-166110 A | 6/2007 |
| WO | 0005895 A1 | 2/2000 |
| WO | 0024124 A1 | 4/2000 |
| WO | 0172005 A1 | 9/2001 |
| WO | 0233969 A1 | 4/2002 |
| WO | 02091676 A1 | 11/2002 |
| WO | 2005062611 A1 | 7/2005 |
| WO | 2010/035264 A1 | 4/2010 |
| WO | 2010/117488 A1 | 10/2010 |
| WO | 2010/117490 A1 | 10/2010 |
| WO | 2010/117496 A2 | 10/2010 |
| WO | 2010/138896 A2 | 12/2010 |
| WO | 2011/035278 A2 | 3/2011 |
| WO | 2012/088350 A2 | 6/2012 |
| WO | 2013/074705 A2 | 5/2013 |

OTHER PUBLICATIONS

Author Unknown, International Search Report dated May 31, 2011, PCT Application No. PCT/US2010/049568, filed Sep. 21, 2010.

Egan, "Multi-Port Entry Adapter, Hub and Method for Interfacing a CATV Network and a MoCA Network", U.S. Appl. No. 12/255,008, filed Oct. 21, 2008.

Wells, "CATV Entry Adapter and Method for Preventing Interface with eMTA Equipment from MoCA Signals", U.S. Appl. No. 12/691,149, filed Jan. 21, 2010.

Hallik, "CATV Entry Adapter and Method Utilizing Directional Couplers for MoCA Signal Communication", U.S. Appl. No. 12/704,833, filed Feb. 12, 2010.

Newby, "Ingress Noise Inhibiting Network Interface Device and Method for Cable Television Networks", U.S. Appl. No. 12/250,229, filed Oct. 13, 2008.

Author Unknown, Office Action Summary dated Nov. 11, 2011, U.S. Appl. No. 12/255,008, filed Oct. 21, 2008.

Author Unknown, Office Action Summary dated Jan. 23, 2012, U.S. Appl. No. 12/250,229, filed Oct. 13, 2008.

Wells, "Passive Multi-Port Entry Adapter and Method for Preserving Downstream CATV Signal Strength within In-Home Network", U.S. Appl. No. 12/563,719, filed Sep. 21, 2009.

Author Unknown, Office Action Summary dated Mar. 6, 2012, U.S. Appl. No. 12/563,719, filed Sep. 21, 2009.

Wells, "Passive-Active Terminal Adapter and Method Having Automatic Return Loss Control", U.S. Appl. No. 12/175,366, filed Jul. 17, 2008.

Alkan, "Home Network Frequency Conditioning Device and Method", U.S. Appl. No. 13/180,100, filed Jul. 11, 2011.

Shafer, "Home Network Frequency Conditioning Device", U.S. Appl. No. 13/178,149, filed Jul. 7, 2011.

Shafer, "Low-Pass Filter Circuit", U.S. Appl. No. 13/167,497, filed Jun. 23, 2011.

Alkan, "Method and Apparatus for Reducing Isolation in a Home Network", U.S. Appl. No. 13/333,060, filed Dec. 21, 2011.

Shafer, "Upstream Bandwidth Conditioning Device", U.S. Appl. No. 12/760,153, filed Apr. 14, 2010.

* cited by examiner

RADIO FREQUENCY SIGNAL SPLITTER

CROSS REFERENCE TO RELATED APPLICATIONS

This application is a continuation of U.S. patent application Ser. No. 14/989,062 (now U.S. Pat. No. 9,641,147), filed Jan. 6, 2016, which is a continuation of U.S. patent application Ser. No. 13/920,423 (now U.S. Pat. No. 9,264,012), filed Jun. 18, 2013, which claims priority to U.S. Provisional Application No. 61/663,953, filed Jun. 25, 2012, the contents of which are all incorporated herein by reference in their entireties.

BACKGROUND OF THE INVENTION

Technical Field

This invention relates generally to electronic devices and in particular to a radio frequency signal splitter device.

State of the Art

Signal splitters are an electronic device that is used to divide an electronic input signal into two or more versions of the input signal. Signal splitters often accept a downstream input signal at an input port, and provide a reduced-power version of the input signal at two or more output ports. In the reverse direction, an upstream signal received at an output port is transmitted to the input port for continued upstream transmission. In general, there is intentionally high isolation (insertion loss) between the output ports of a signal splitter. This means that there is a high amount of attenuation in a transmission path extending from one splitter output port to another splitter output port.

High isolation (high insertion loss) between output ports is often a desirable feature in a signal splitter. There are applications, however, where it is desirable to transmit signals between output ports of a signal splitter with a minimum of attenuation. In particular it is desirable in some applications to provide a signal splitter that operates in at least two radio-frequency bands of operation, a first radio-frequency band and a second radio-frequency band. High isolation is desirable between splitter output ports in the first frequency band, but low isolation—less attenuation—is desired in the second frequency band. Lowering the isolation between output ports of a splitter has been implemented in some particular splitter devices, but there are drawbacks, including reduced splitter performance outside the particular frequency band of interest, and isolation that is still too high within the particular frequency band of interest. Thus there is a need for an electronic splitter device that provides frequency dependent splitter performance, including high isolation between output ports in a first frequency band, and low isolation between output ports in a second frequency band, without compromising splitter performance in either the first or the second frequency bands.

DISCLOSURE OF THE INVENTION

The disclosed invention relates to electronic devices and in particular to a radio frequency signal splitter device.

Disclosed is an electronic signal splitter device with sufficient frequency bandwidth to support community access television (CATV) signal frequencies as well as in-home entertainment (IHE) signal frequencies. The CATV signal frequencies are conducted between an input port and one or more output ports (and vice versa). The in-home entertainment signal frequencies are conducted from any of the output ports, to any of the other output ports, and between the input port and any of the output ports (and vice versa). The application of the disclosed novel coupled transmission line element lowers the isolation between the output ports for signals in the in-home entertainment spectrum, while leaving relatively higher isolation between the output ports for the signals in the CATV spectrum. The inherent isolation characteristics of a classic signal splitter are modified to reduce the isolation in a given frequency band (i.e., MOCA or other IHE signal frequency bands) or above a certain given signal frequency boundary.

In some embodiments the coupled transmission line element includes a first electrically conductive wire and a second electrically conductive wire. In some embodiments the first electrically conductive wire includes a first electrically conductive wire length, a first electrically conductive wire first end electrically coupled to the in-home entertainment signal transmission path, and a first electrically conductive wire second end, where the first electrically conductive wire second end is un-terminated. In some embodiments the second electrically conductive wire includes a second electrically conductive wire length, a second electrically conductive wire first end electrically coupled to the in-home entertainment signal transmission path, and a second electrically conductive wire second end, where the second electrically conductive wire second end is un-terminated. In some embodiments the first electrically conductive wire and the second electrically conductive wire are twisted into an approximation of a helix such that the first electrically conductive wire and the second electrically conductive wire are electrostatically coupled. In some embodiments an electrical short connection does not exist between the first electrically conductive wire and the second electrically conductive wire.

In some embodiments an in-home entertainment signal transmission path includes a resistor. In some embodiments the in-home entertainment signal transmission path includes a first inductor positioned between the first output port and the resistor. In some embodiments the in-home entertainment signal transmission path includes a second inductor positioned between the second output port and the resistor. In some embodiments the first electrically conductive wire first end is coupled to the first output port. In some embodiments the first electrically conductive wire first end is coupled to a node between the first inductor and the resistor. In some embodiments the second electrically conductive wire first end is coupled to the second output port. In some embodiments the second electrically conductive wire first end is coupled to a node between the second inductor and the resistor. In some embodiments the length of the first electrically conductive wire is a different value than the length of the second electrically conductive wire.

In some embodiments the coupled transmission line element further comprises a third electrically conductive wire. In some embodiments the third electrically conductive wire includes a third electrically conductive wire length, a third electrically conductive wire first end electrically coupled to a current return path, and a third electrically conductive wire second end, where the third electrically conductive wire second end is un-terminated. In some embodiments the third electrically conductive wire is integrated into the helix formed by the first and the second electrically conductive wire, such that the third electrically conductive wire is electrostatically coupled to both the first and the second electrically conductive wires. In some embodiments more than three electrically conductive wires are included in the coupled transmission line element.

Disclosed is a signal splitter that includes an input port, a first output port, a second output port, and a signal transmission path conducting signals between the first and the second output port. The signal splitter also includes a coupled transmission line element coupled to the signal transmission path, wherein the coupled transmission line element includes a first elongate electrical conductor and a second elongate electrical conductor. The first elongate electrical conductor includes a first elongate electrical conductor first end coupled to the signal transmission path, a first elongate electrical conductor second end, where the first elongate electrical conductor second end is un-terminated, and a first elongate electrical conductor length extending between the first elongate electrical conductor first end and the first elongate electrical conductor second end. The second elongate electrical conductor includes a second elongate electrical conductor first end coupled to the signal transmission path, a second elongate electrical conductor second end, where the second elongate electrical conductor second end is un-terminated, and a second elongate electrical conductor length extending between the second elongate electrical conductor first end and the second elongate electrical conductor second end. The first elongate electrical conductor and the second elongate electrical conductor are not shorted together, and the first elongate electrical conductor and the second elongate electrical conductor are electrostatically coupled.

In some embodiments the signal transmission path includes at least one resistor. In some embodiments the signal transmission path includes at least one inductor. In some embodiments the signal transmission path includes one resistor. In some embodiments the signal transmission path includes a first inductor positioned between the first output port and the resistor. In some embodiments the signal transmission path includes a second inductor positioned between the second output port and the resistor. In some embodiments the first elongate electrical conductor first end is coupled to the first output port. In some embodiments the first elongate electrical conductor first end is coupled to a node between the first inductor and the resistor. In some embodiments the second elongate electrical conductor first end is coupled to the second output port. In some embodiments the second elongate electrical conductor first end is coupled to a node between the second inductor and the resistor. In some embodiments the length of the first electrically conductive wire is a different value than the length of the second electrically conductive wire.

In some embodiments the coupled transmission line element further comprises a third elongate electrical conductor. The third elongate electrical conductor includes a third elongate electrical conductor length, a third elongate electrical conductor first end electrically coupled to a current return path, and a third elongate electrical conductor second end, where the third elongate electrical conductor second end is un-terminated. In some embodiments the third elongate electrical conductor is electrostatically coupled to both the first and the second elongate electrical conductors. In some embodiments the length of the third elongate electrical conductor is a different value than the length of the first elongate electrical conductor. In some embodiments the length of the third elongate electrical conductor is a different value than the length of the second elongate electrical conductor. In some embodiments more than three elongate electrical conductors are included in the coupled transmission line element.

Disclosed is a method of modifying the isolation between the output ports of an electronic signal splitter, the method comprising several steps. The method of modifying the isolation between the output ports of an electronic signal splitter according to the invention includes the step of coupling a first end of a first electrically conductive wire to an in-home entertainment signal transmission path of the signal splitter, where the in-home entertainment signal transmission path couples a first output port of the signal splitter to a second output port of the signal splitter. The method of modifying the isolation between the output ports of an electronic signal splitter according to the invention also includes the step of coupling a first end of a second electrically conductive wire to an in-home entertainment signal transmission path of the signal splitter. The method of modifying the isolation between the output ports of an electronic signal splitter according to the invention includes the step of twisting the first electrically conductive wire and the second electrically conductive wire together to form an approximation of a helix. In some embodiments the first electrically conductive wire includes a first insulating coating, and the second electrically conductive wire includes a second insulating coating. In some embodiments there is no an electrical short circuit connection between the first electrically conductive wire and the second electrically conductive wire. In some embodiments the length of the first electrically conductive wire is a different value than the length of the second electrically conductive wire. In some embodiments the method includes the steps of coupling a first end of a third electrically conductive wire to a current return path, and twisting the first electrically conductive wire, the second electrically conductive wire, and the third electrically conductive wire together to form an approximation of a helix. In some embodiments the length of the third electrically conductive wire is a different value than the length of the first electrically conductive wire.

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

As discussed above, embodiments of the present invention relate to electronic devices and in particular to a radio frequency signal splitter device.

Signal splitters are often designed to have intentionally high insertion loss, or isolation, between their output ports. In some signal splitters the high isolation between output ports is an inherent and desirable quality. In some applications however, it is desirable to have lower isolation between the output ports for signals within a specific frequency range. Disclosed is a signal splitter that includes a coupled transmission line element connected between two of its output ports. The coupled transmission line element is used to lower the isolation between the two output ports for a particular frequency band, while leaving the isolation between the two output ports high for a different specific frequency band. The coupled transmission line element includes a first and a second elongate electrical conductor. The first and the second elongate electrical conductor first ends are coupled to the signal transmission path between the two output ports. The first and the second elongate electrical conductor second ends are un-terminated. The first elongate electrical conductor and the second elongate electrical conductor are not shorted together, and the first elongate electrical conductor and the second elongate electrical conductor are electrostatically coupled, such as by twisting them together into a helix.

Figure 1:
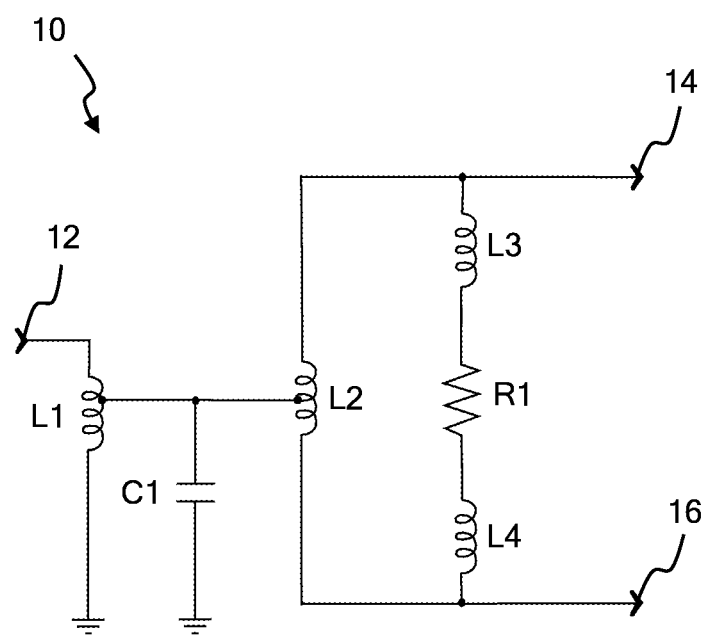
FIG. 1 shows an example schematic of a signal splitter.

FIG. 1 shows an example schematic diagram of classic signal splitter 10. Signal splitter 10 include port 12, port 14, and port 16. In this document port 12 is the input port and port 14 and port 16 are a first and a second output port. With this naming convention, a signal incident upon input port 12 is divided into two lower-power signals, one each exiting signal splitter 10 at output port 14 and 16. It is to be understood, however, that signal splitter 12 also works in the reverse direction, as a signal combiner. In this situation signals incident upon output ports 14 and 16 are combined and exit signal splitter 10 at input port 12. Thus while ports are labeled as input or output ports, it is to be understood that these are relative terms and the signal ports can each be either an input port or an output port depending on the direction of the signals.

Signal splitter 10 shown in FIG. 1 is often used to split the signal received at input port 12 into two lower-power signals that exit splitter 10 at output ports 14 and 16, and/or to combine signals received at output ports 14 and 16 into a single signal at input port 12. Inductor L2 is the splitting transformer that splits signal power between port 14 and port 16. Inductor L1 is an impedance matching transformer that matches the external system impedance of port 12 to the impedance of input port 12, which in this example is the same as the impedance seen at port 14 and 16. Capacitor C1 optimizes the operation of splitter 10, mainly used to tune stray inductances. Resistor R1 is a balancing resistor for obtaining optimum return loss and isolation between output ports 14 and 16. Inductors L3 and L4 are balancing inductors commonly used to optimize the isolation performance between output port 14 and 16.

Splitter 10 provides performance that is usually desired from a signal splitter, including relatively good return loss (system impedance matching) at input port 12 and output ports 14 and 16 an insertion loss from input port 12 to either of the output ports 14 or 16 that is consistent with the law of conservation of power (about 3.01 dB plus any added nonideal/parasitic losses. The insertion loss from either output port 14 or 16 to the input port is the same.

intentionally high signal insertion loss, referred to as isolation, for a signal passing from one of output ports 14 or 16 to the other of output port 14 or 16.

The novel splitter designs described in this document were developed because of an application where the high isolation (high insertion loss) between output ports 14 and 16 is not desired for all signal frequencies. It is desired in a community access television (CATV) system application to have a splitter that has high insertion loss or isolation between output ports of the splitter for a first frequency band of interest, and low isolation between splitter output ports for a second frequency band of interest. The goal was to reduce the isolation in the second frequency band without compromising the splitter's other performance characteristics. Installing lumped elements including resistors, capacitors, and inductors along the signal path between the splitter output ports 14 and 16 was found to be unsatisfactory because outside the frequency band of interest there was degradation in performance in one or more splitter performance characteristics, and, within the frequency band of interest, there was a need to further reduce isolation between the output ports.

Community access television, or cable television, (CATV) networks use an infrastructure of interconnected coaxial cables, splitters, amplifiers, filters, trunk lines, cable taps, drop lines and other signal-conducting devices to supply and distribute high frequency "downstream" signals from a main signal distribution facility, known as a head-end, toward subscriber premises such as homes and businesses. The downstream signals operate the subscriber equipment, such as television sets, telephones, and computers. The typical CATV network is a two-way communication system. CATV networks also transmit "upstream" signals from the subscriber equipment back to the head-end of the CATV network. For example, upstream bandwidth may include data related to video-on-demand services, such as video requests and billing authorization. Two-way communication is also utilized when using a personal computer connected through the CATV infrastructure to the public Internet, for example when sharing photo albums or entering user account information. In most CATV networks the downstream frequency band, or downstream bandwidth, is within the range of 54-1002 megahertz (MHz) and the upstream frequency band, or upstream bandwidth, is within the range of 5-42 MHz. Thus the CATV signals operate within a first frequency band, where the first frequency band is from 5-1002 MHz in this example.

An in-home entertainment (IHE) network may be coupled to the CATV network via the same coaxial cable delivering the downstream and upstream bandwidth of the CATV system. The in-home entertainment network can be a network providing multiple streams of high definition video and gaming entertainment. Examples of in-home entertainment network technologies include Ethernet, HomePlug, Home Phoneline Networking Alliance (HPNA), Multimedia over Coax Alliance (MoCA) and 802.11n protocols. The in-home entertainment (IHE) network is coupled to the CATV network within a subscriber premises to allow the CATV network to distribute IHE signals from one multimedia device to another within the subscriber premises. The multimedia devices in a CATV system are each connected to an output port of a signal splitter, so in a CATV system, IHE signals are delivered between multimedia devices by travelling between the splitter output ports of a signal splitter.

Since the operation of the subscriber premises IHE network must occur simultaneously with the operation of the CATV services, the IHE signals often utilize a frequency range different from the frequency ranges of the CATV upstream and downstream signals. A typical IHE frequency band is 1125-1675 MHz, which is referred to in this document as the IHE signal frequency range, or bandwidth. A specific IHE network technology can includes other frequency ranges, but the 1125 to 1675 MHz frequency range is of major relevance because of its principal use in establishing connections between the multimedia devices within a subscriber network. Thus the IHE signals use a second frequency band of interest, where in this example the second frequency band is from 1125 to 1675 MHz.

It is to be understood that while the example frequency ranges discussed in this document include a first frequency range that is the CATV frequency band from 5-1002 MHz, and a second frequency range that is the IHE frequency band from 1125-1675, the invention is not limited to the use of these two frequency ranges or types of signals. The first frequency range can be any range of signal frequencies. The second frequency range can be any range of signal frequencies. The first frequency range can be a range that transmits any types of signals. In some embodiments the first frequency range transmits signals other than CATV signals. The second frequency range can be a range that transmits any type of signals. In some embodiments the second frequency range transmits signals other than IHE signals.

Although using the in-home cable infrastructure as the communication medium substantially simplifies the implementation of the IHE network, there are certain disadvantages to doing so. One noted problem arises when IHE signals pass between output ports of a conventional splitter en route to another IHE-enabled device within the network. The CATV entry adapter was not originally intended to communicate IHE signals between its ports, as is necessary to achieve IHE communication in the IHE network. To implement the IHE network, the IHE signals must traverse between the output ports of a signal splitter.

As discussed earlier, the typical signal splitter has a high degree of signal rejection or isolation between its output ports. When the in-home entertainment signals traverse between the separate signal component legs of the splitter, the degree of signal rejection or isolation greatly attenuates the strength of the IHE signals. Thus it is desirable to have a system which transmits both CATV signal of a first frequency range, and IHE signals of a second frequency range. The desire is to have high signal isolation between the splitter output ports for CATV signals of the first frequency range, but low signal isolation between the splitter ports for IHE signal travelling from one splitter output port to another. Thus the IHE signal can travel between splitter output ports, and from one multimedia device to another within the IHE network, without attenuating or rejecting the IHE signals that are travelling between splitter legs.

Figure 2:
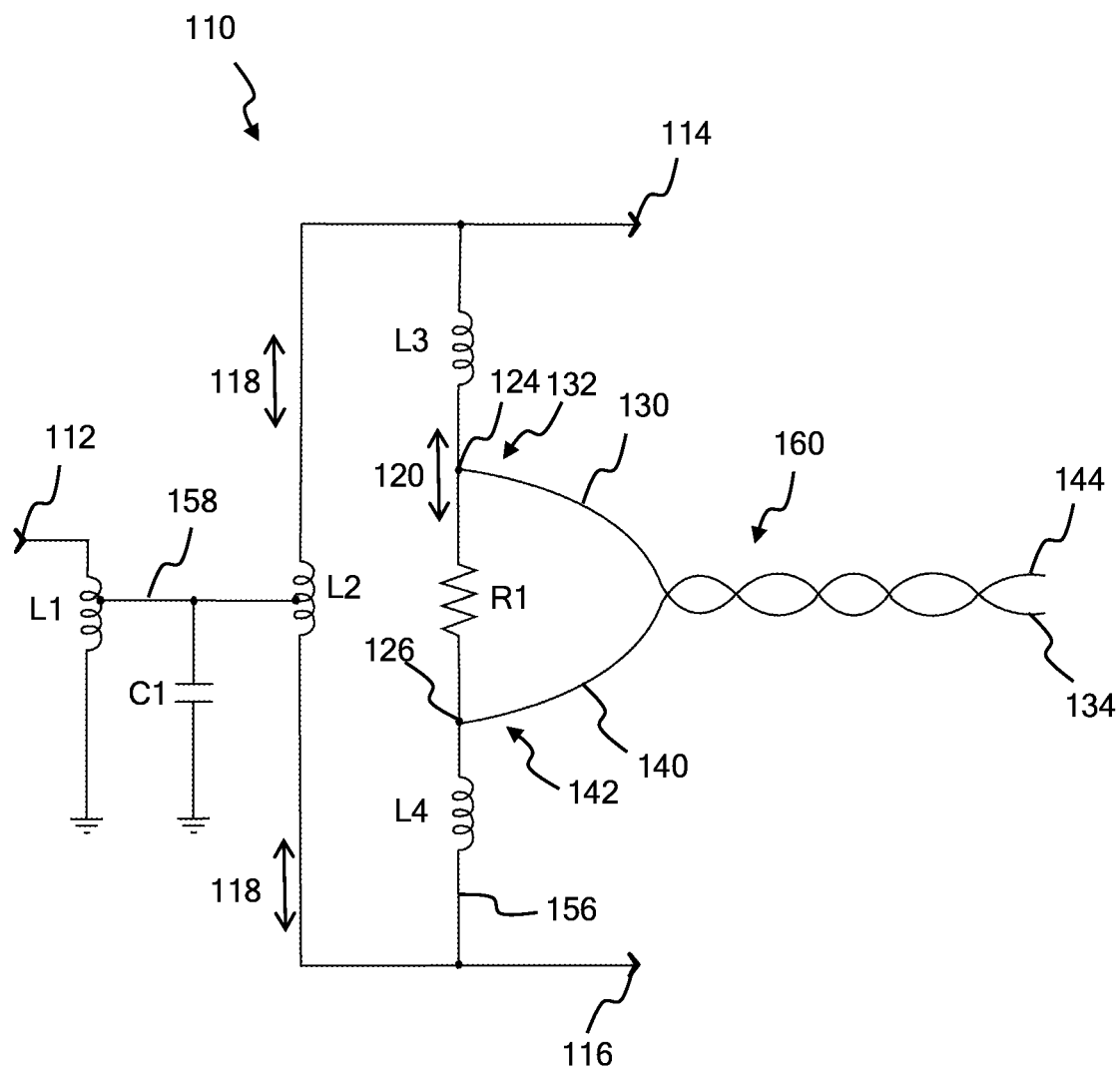
FIG. 2 shows a schematic diagram of one embodiment of signal splitter 110 according to the invention.

FIG. 2 shows a schematic diagram of an embodiment of splitter 110 according to the invention. Splitter 110 includes input port 112, first output port 114, and second output port 116. The inductive and resistive components of splitter 110 are the same or similar as for splitter 10 of FIG. 1. Splitter 110 includes coupled transmission line element 160, which is coupled to signal transmission path 156 of splitter 110. For splitter 110 according to the invention, the signal isolation between first output port 114 and second output port 116 is lower for the IHE signal frequency band of 1125-1675 MHz than the isolation between first output port 114 and second output port 116 for the CATV signal frequency band of 5-1002 MHz. Splitter 110 according to the invention uses coupled transmission line element 160 to reduce the signal isolation in a first frequency band, while leaving higher signal isolation in a second frequency band, and not compromising other splitter performance parameters. In this embodiment the first frequency band is the CATV signal frequency band of 5-1002 MHz, and the second frequency band is the IHE signal frequency band of 1125-1675 MHz.

Splitter 110 of FIG. 2 is an electronic signal splitter device that includes CATV signal transmission path 158 and IHE signal transmission path 156. CATV signal transmission path 158 conducts CATV signals 118 of the first frequency band of 5-1002 MHz between input port 112 and first and second output ports 114 and 116. IHE signal transmission path 156 conducts IHE signals 120 of the second frequency band of 1125-1675 MHz between first output port 114 and second output port 116. Coupled transmission line element 160 lowers the signal isolation for IHE signals being conducted along IHE signal transmission path 156, while maintaining higher signal isolation for CATV signals being conducted along CATV signal transmission path 158.

Coupled transmission line element 160 in this embodiment includes two elongate electrical conductors, first elongate electrical conductor 130, and second elongate electrical conductor 140. In some embodiments coupled transmission line element 160 includes three elongate electrical conductors. In some embodiments coupled transmission line element 160 includes more than three elongate electrical conductors. An elongate electrical conductor is any length of electrically conductive material with a first end and a second end, and an electrically conductive path between the first end and the second end. In some embodiments the elongate electrical conductor is a trace on a printed circuit board. In some embodiments the elongate electrical conductor is an electrically conductive wire. In some embodiments the elongate electrical conductor is some other form of electrically conductive material with a first end, a second end, and a length of electrically conductive material between the first end and the second end.

Figure 3:
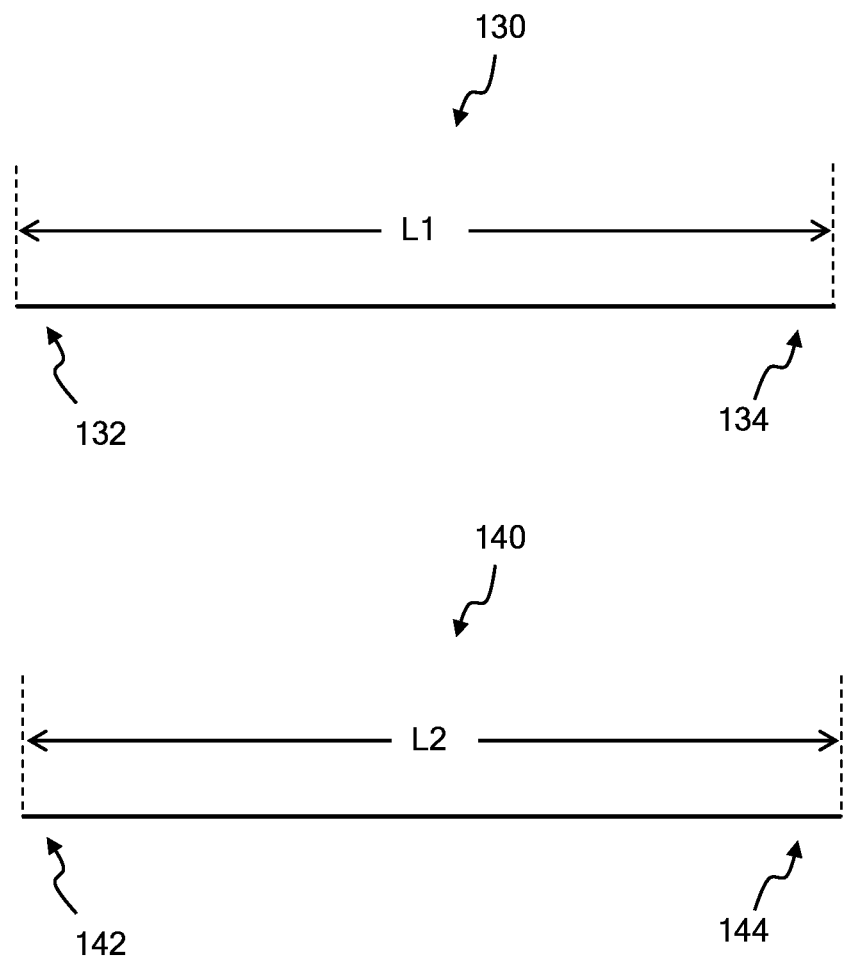
FIG. 3 shows side views of embodiments of first and second elongate electrical conductors 130 and 140 according to the invention.

FIG. 3 shows a side view embodiment of elongate electrical conductors 130 and 140. First elongate electrical conductor 130 includes first elongate electrical conductor first end 132, first elongate electrical conductor second end 134, and first elongate electrical conductor length L1 of electrically conductive material between first end 132 and second end 134. Second elongate electrical conductor 140 includes second elongate electrical conductor first end 142, second elongate electrical conductor second end 144, and second elongate electrical conductor length L2 of electrically conductive material between first end 142 and second end 144. In this embodiment first and second elongate electrical conductors 130 and 140 are electrical traces on a printed circuit board, but this is an example only and other embodiments are foreseen.

Figure 4:
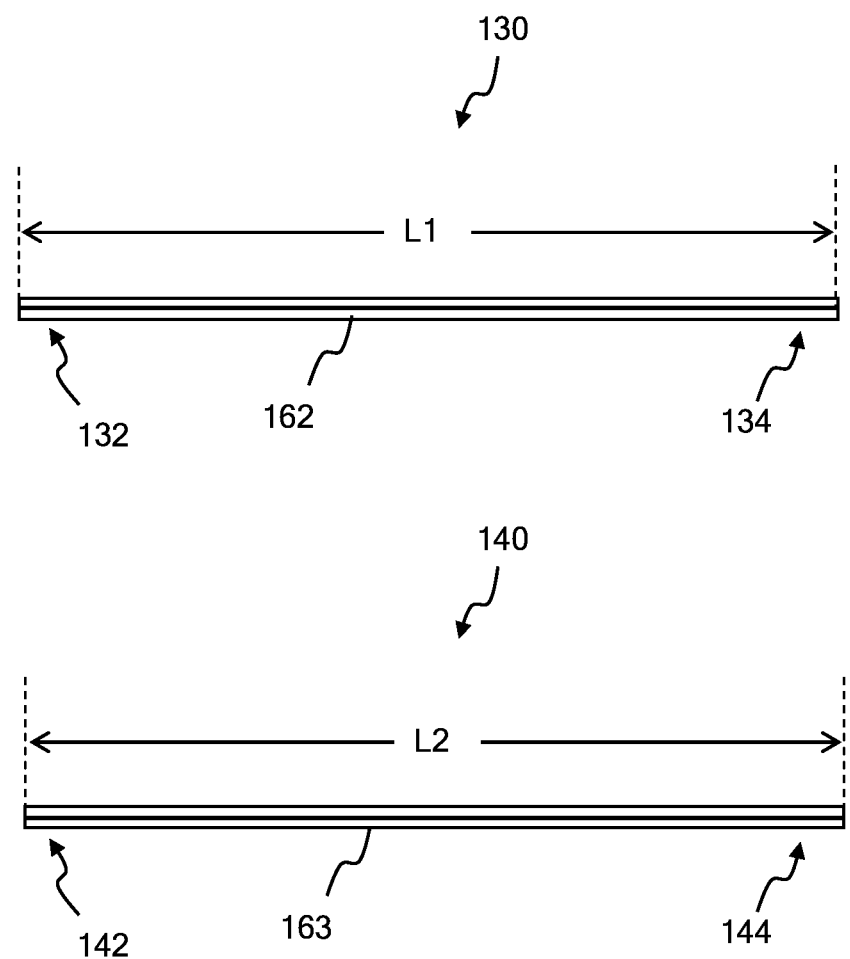
FIG. 4 shows side cutaway views of further embodiments of first and second elongate electrical conductors 130 and 140 according to the invention. In this embodiment first and second elongate electrical conductors 130 and 140 are first and second electrically conducting wires 130 and 140 with first and second insulating coatings 162 and 163.

FIG. 4 shows a side view cutaway of a further embodiment of elongate electrical conductors 130 and 140. FIG. 4 shows elongate electrical conductors 130 and 140 of splitter 110 of FIG. 2. First elongate electrical conductor 130 includes first elongate electrical conductor first end 132, first elongate electrical conductor second end 134, and first elongate electrical conductor length L1 of electrically conductive material between first end 132 and second end 134. First elongate electrical conductor 130 in this embodiment is electrically conductive wire 130 with first insulating coating 162. Second elongate electrical conductor 140 includes second elongate electrical conductor first end 142, second elongate electrical conductor second end 144, and second elongate electrical conductor length L2 of electrically conductive material between first end 142 and second end 144. Second elongate electrical conductor 140 in this embodiment is electrically conductive wire 140 with second insulating coating 163.

In the embodiment of splitter 110 shown in FIG. 2. First electrically conductive wire 130 first end 132 is coupled to in-home entertainment signal transmission path 156. First electrically conductive wire 130 second end 134 is un-terminated, meaning it is not electrically coupled to anything. Second electrically conductive wire 140 first end 142 is coupled to in-home entertainment signal transmission path 156. Second electrically conductive wire 140 second end 144 is un-terminated. First and second electrically conductive wires 130 and 140 do not have a conductive path between them, meaning there is no short circuit between first and second electrically conductive wires 130 and 140, or any other path for electrons to travel between first and second electrically conductive wires 130 and 140. However, first and second electrically conductive wires 130 and 140 are electrostatically coupled. Electrostatic coupling as used in this document is also known as inductive coupling, magnetic coupling, or electromagnetic coupling. Electrostatic coupling is the coupling between two conductive elements where a current or voltage in one of the conductive elements causes a current or voltage in the other conductive element, when there is no current path between the two conductive elements.

First and second electrically conductive wires 130 and 140 are electrostatically coupled in the embodiment shown in FIG. 2 by twisting the wires together to form a helix, or an approximation of a helix. In some embodiments first and second electrically conductive wires 130 and 140 are electrostatically coupled by forming them into a helical coil. In some embodiments first and second electrically conductive wires 130 and 140 are electrostatically coupled by forming them into some other positional arrangement where there is electrostatic coupling between first and second electrically conductive wires 130 and 140. It is the electrostatic coupling between first and second electrically conductive wires 130 and 140 which lowers the signal isolation in the IHE signal frequency band for IHE signals 120 being conducted from first output port 114 to second output port 116 and vice versa.

In some embodiments the rate of twist of electrically conductive wires 130 and 140 is constant along the lengths of the wires 130 and 140. In some embodiments the rate of twist of electrically conductive wires 130 and 140 varies along the lengths of the wires 130 and 140. In some embodiments the length L1 of first electrically conductive wire 130 is a different value than the length L2 of second electrically conductive wire 140.

In embodiments where elongate electrical conductors 130 and 140 are electrical traces 130 and 140 or take other forms, elongate electrical conductors 130 and 140 can be electrostatically coupled in many different ways. Electrical traces 130 and 140 can be electrostatically coupled by varying their shape and direction on the printed circuit board such that there is electrostatic coupling between elongate electrical conductors 130 and 140. In some embodiments the distance between elongate electrical conductors can be the same, or vary along the length of electrical traces 130 and 140.

Figure 5:
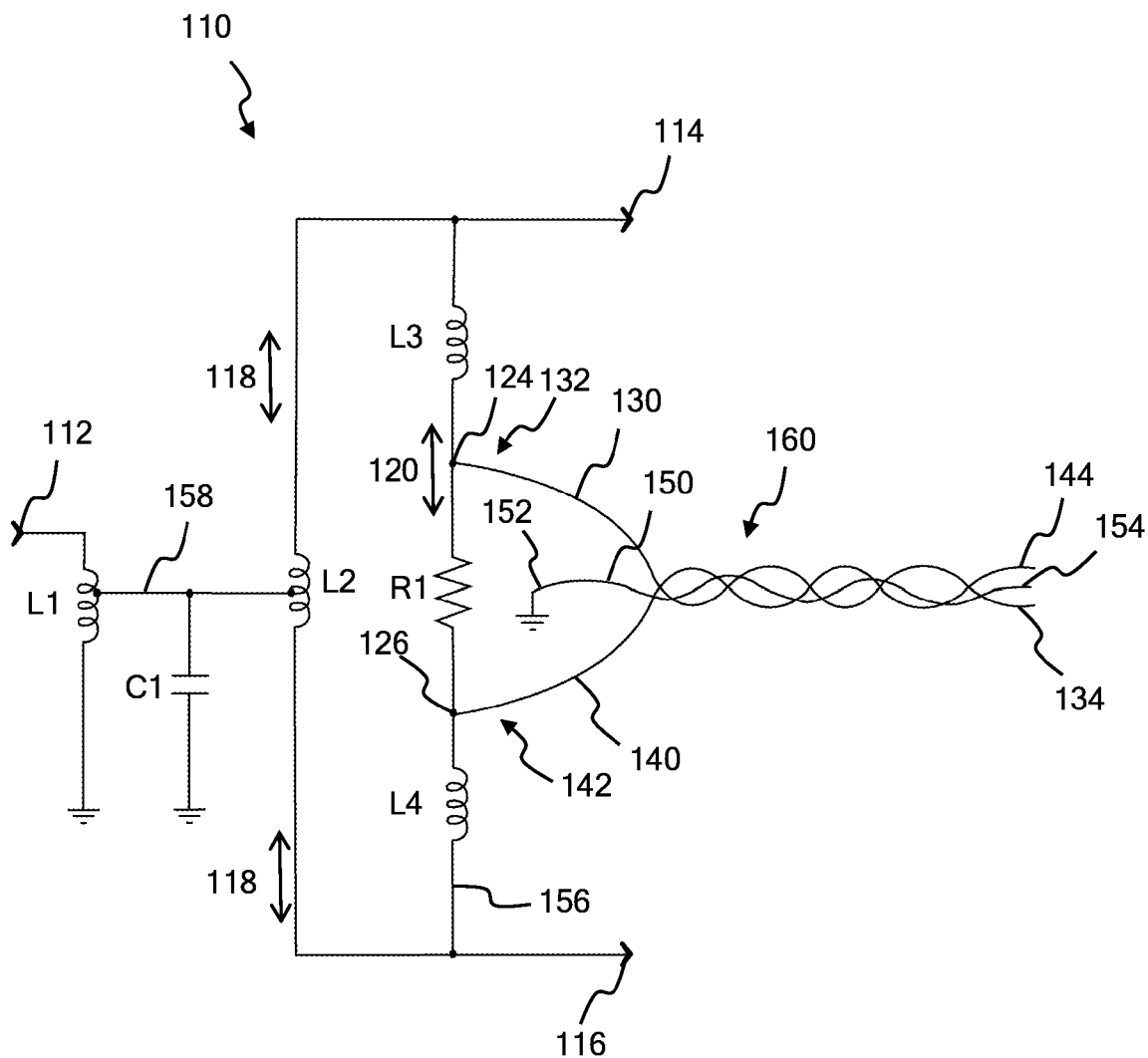
FIG. 5 shows a schematic diagram of an additional embodiment of signal splitter 110 according to the invention.

In some embodiments coupled transmission line element 160 includes a ground plane that is electrostatically coupled to elongate electrical conductors 130 and 140. FIG. 5. shows a schematic diagram of another embodiment of splitter 110 according to the invention, with similar numbers representing the same or similar elements. In this embodiment splitter 110 is similar to splitter 110 of FIG. 2, with the addition of ground plane conductor 150. Ground plane conductor 150 is an elongate electrical conductor that can take any of the forms described for elongate electrical conductors 130 and 140, such as elongate electrical conductor 150 as shown in FIG. 6, or elongate electrical conductor 150 as shown in FIG. 7.

Figure 6:
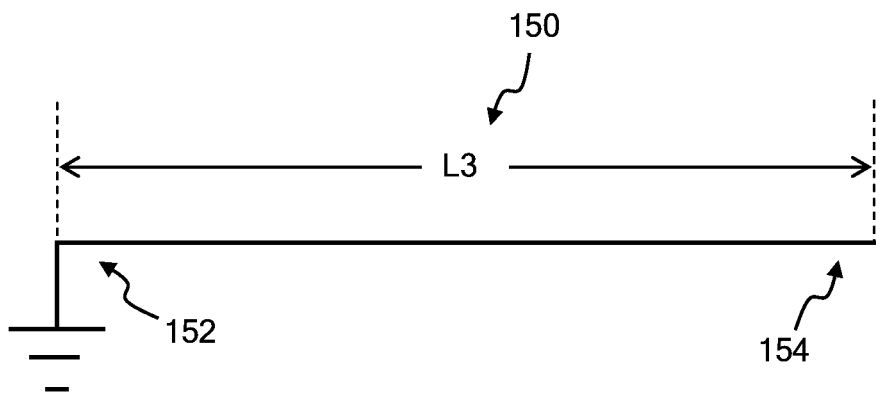
FIG. 6 shows a side view embodiment of third elongate electrical conductor 150 according to the invention.
Figure 7:
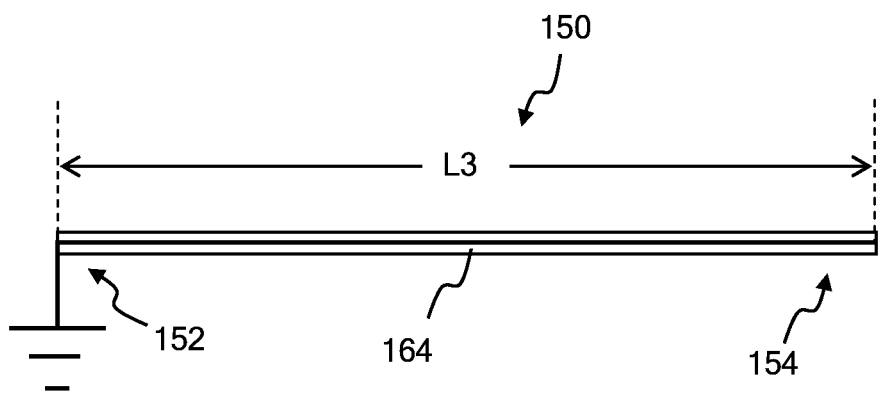
FIG. 7 shows a side view of another embodiment of third elongate electrical conductor 150 according to the invention, where elongate electrical conductor 150 is electrically conductive wire 150 with insulating coating 164.

Elongate electrical conductor 150 as shown in FIG. 6 is elongate trace 150 with elongate electrical conductor first end 152, elongate electrical conductor second end 154, and length L3 of electrical trace extending from first end 152 to second end 154. Elongate electrical conductor 150 as shown in FIG. 7 is electrically conductive wire 150 with electrically conductive wire first end 152, electrically conductive wire second end 154, and length L3 of electrically conductive wire extending from first end 152 to second end 154, covered by electrically insulating coating 164.

In the embodiment shown in FIG. 5, electrically conductive wire first end 152 is coupled to a current return path, also referred to as ground, ground plane, or circuit board ground plane. Electrically conductive wire second end 154 is un-terminated. Electrically conductive wire 150 is electrostatically coupled to electrically conductive wires 130 and 140. In this embodiment electrically conductive wire 150 is electrostatically coupled to electrically conductive wires 130 and 140 by twisting electrically conductive wire 150 into the helix with electrically conductive wires 130 and 140. In some embodiments electrically conductive wire 150 is coupled to the ground plane at second end 154. In some embodiments electrically conductive wire 150 is coupled to the ground plane at other positions along electrically conductive wire 150 length L3. In some embodiments the length L3 of electrically conductive wire 150 is a different value than the length L1 of electrically conductive wire 130. In some embodiments the length L3 of electrically conductive wire 150 is a different value than the length L2 of electrically conductive wire 140. In some embodiments electrically conductive wire 150 is electrostatically coupled to electrically conductive wires 130 and 140 using another method.

Elongate electrical conductors 130 and 140 can be coupled to IHE signal transmission path 156 at many different points. In the embodiment shown in FIG. 2 and FIG. 5, IHE signal transmission path includes inductor L3 coupled at one end to first output port 114, and at the other end to node 124. IHE signal transmission path 156 in these embodiments also includes resistor R1 coupled at one end to node 124, and at the other end to node 126. In the embodiment shown in FIG. 2 and FIG. 5, IHE signal transmission path includes inductor L4 coupled at one end to second output port 116, and at the other end to node 126. It is to be understood that IHE signal transmission path can include many other electronic components, and many other interconnect schematics.

In the embodiments of splitter 110 according to the invention of FIG. 2 and FIG. 5, electrically conductive wire 130 first end 132 is connected to node 124, and electrically conductive wire 140 first end 142 is coupled to node 126, but these connections are not meant to be limiting. In some embodiments electrically conductive wire 130 first end 132 is connected to other points along IHE signal transmission path 156. In some embodiments electrically conductive wire 140 first end 142 is connected to other points along IHE signal transmission path 156.

Figure 8:
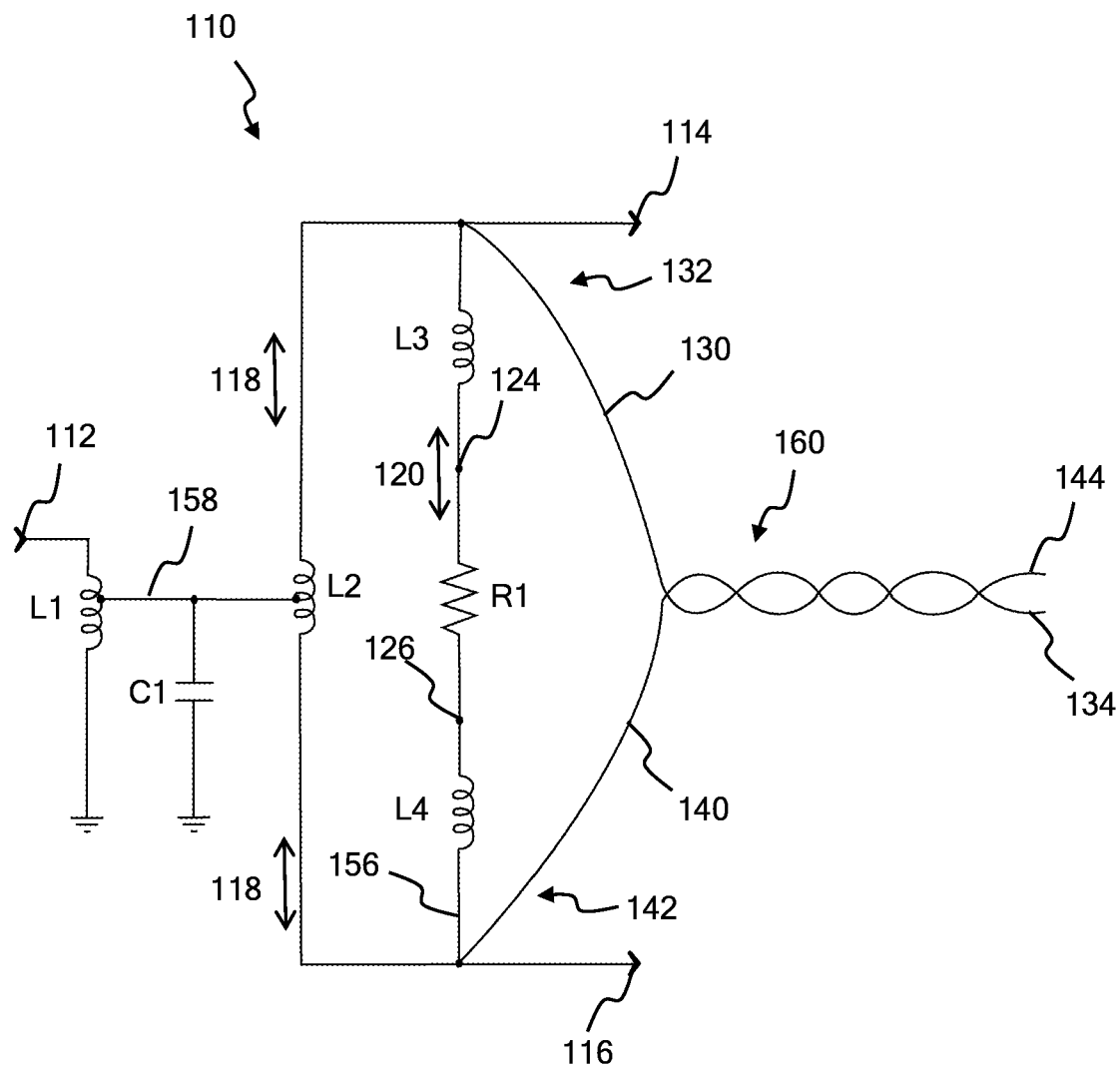
FIG. 8 shows a schematic diagram of another embodiment of signal splitter 110 according to the invention.
Figure 9:
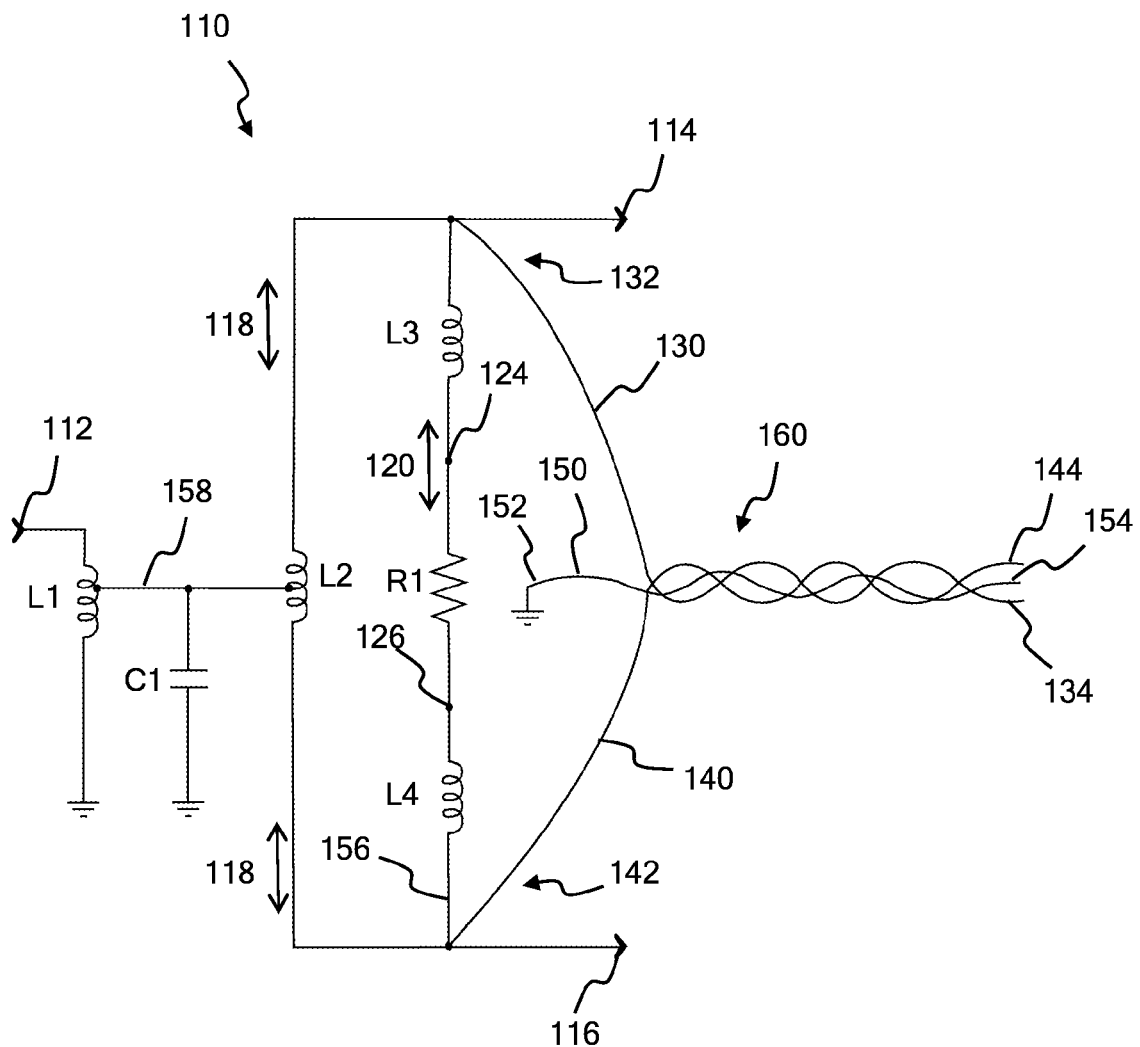
FIG. 9 shows a schematic diagram of a further embodiment of signal splitter 110 according to the invention

FIG. 8 and FIG. 9 show schematic embodiments of further embodiments of splitter 110 according to the invention. Splitter 110 of FIG. 8 is similar to splitter 110 of FIG. 2, except that electrically conductive wire 130 first end 132 is connected to output port 114, and electrically conductive wire 140 first end 142 is coupled to output port 116. Splitter 110 of FIG. 9 is similar to splitter 110 of FIG. 5, except that electrically conductive wire 130 first end 132 is connected to output port 114, and electrically conductive wire 140 first end 142 is coupled to output port 116. It is to be understood that splitter 110 according to the invention can include many other electrical components and many other electrical connection schematics.

Figure 10:
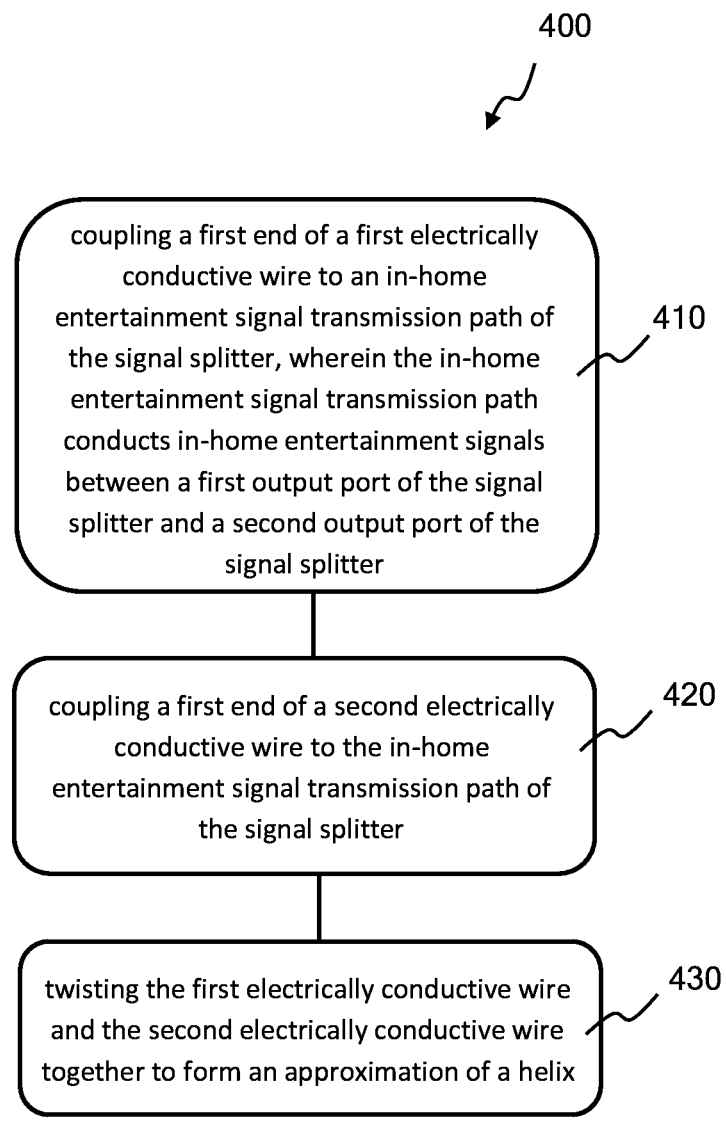
FIG. 10 is an illustration of method 400 of modifying the isolation between the output ports of an electronic signal splitter according to the invention.

FIG. 10 illustrates method 400 of modifying the isolation between the output ports of an electronic signal splitter. Method 400 includes step 410 of coupling a first end of a first electrically conductive wire to an in-home entertainment signal transmission path of the signal splitter, where the in-home entertainment signal transmission path conducts in-home entertainment signals between a first output port of the signal splitter and a second output port of the signal splitter. Method 400 includes step 420 of coupling a first end of a second electrically conductive wire to the in-home entertainment signal transmission path of the signal splitter. Method 400 includes step 430 of twisting the first electrically conductive wire and the second electrically conductive wire together to form an approximation of a helix. There is no an electrical short circuit connection between the first electrically conductive wire and the second electrically conductive wire. The first electrically conductive wire and the second electrically conductive wire are electrostatically coupled. Method 400 can include many other steps. In some embodiments the first electrically conductive wire includes a first insulating coating, and the second electrically conductive wire includes a second insulating coating. In some embodiments the length of the first electrically conductive wire is a different value than the length of the second electrically conductive wire.

In some embodiments method 400 includes the step of coupling a first end of a third electrically conductive wire to a current return path. In some embodiments method 400 includes the step of twisting the first electrically conductive wire, the second electrically conductive wire, and the third electrically conductive wire together to form an approximation of a helix. In some embodiments the length of the third electrically conductive wire is a different value than the length of the first electrically conductive wire.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above.

What we claim is:

1. A radio frequency signal splitter comprising:
a first output port;
a second output port;
a signal transmission path configured to conduct signals between the first output port and the second output port;
a first electrically conductive wire portion, and
a second electrically conductive wire portion,
wherein the first electrically conductive wire portion and the second electrically conductive wire portion are configured to reduce isolation on the signal transmission path for frequencies of the signals in a first frequency band more than for the frequencies of the signals outside the first frequency band.

2. The splitter of claim 1, wherein:
the signal transmission path is configured to conduct in-home entertainment signals between the first output port and the second output port, and
the first frequency band is an in-home entertainment frequency band.

3. The splitter of claim 2, in-home entertainment frequency band is about 1125 MHz to about 1675 MHz.

4. The splitter of claim 1, wherein the first electrically conductive wire portion and the second electrically conductive wire portion are configured to reduce the isolation on the signal transmission path via electrostatic coupling between the first electrically conductive wire portion and the second electrically conductive wire portion.

5. A radio frequency signal splitter comprising:
a first output port;
a second output port;
a signal transmission path configured to conduct signals between the first output port and the second output port; and
a first electrically conductive wire portion and a second electrically conductive wire portion configured to reduce isolation on the signal transmission path for the signals conducted between the first output port and the second output port,
wherein the first electrically conductive wire portion comprises:
a first electrically conductive wire length;
a first electrically conductive wire first end electrically coupled to the signal transmission path; and
a first electrically conductive wire second end, wherein the first electrically conductive wire second end is un-terminated; and
wherein the second electrically conductive wire portion comprises:
a second electrically conductive wire length;
a second electrically conductive wire first end electrically coupled to the signal transmission path; and
a second electrically conductive wire second end, wherein the second electrically conductive wire second end is un-terminated.

6. The splitter of claim 5, wherein the first electrically conductive wire first end is coupled to the first output port, and the second electrically conductive wire first end is coupled to the second output port.

7. A radio frequency signal splitter comprising:
a first output port;
a second output port;
a signal transmission path configured to conduct signals between the first output port and the second output port; and
a first electrically conductive wire portion and a second electrically conductive wire portion configured to reduce isolation on the signal transmission path for the signals conducted between the first output port and the second output port,
wherein the signal transmission path comprises:
a resistor;
a first inductor positioned between the first output port and the resistor; and a second inductor positioned between the second output port and the resistor.

8. A radio frequency signal splitter comprising:
a first output port;
a second output port;
a signal transmission path configured to conduct signals between the first output port and the second output port; and
a first electrically conductive wire portion and a second electrically conductive wire portion configured to reduce isolation on the signal transmission path for the signals conducted between the first output port and the second output port,
  wherein the coupled transmission line element further comprises a third electrically conductive wire portion configured to:
    electrically couple to a current return path; and
    electrostatically couple to both the first and the second electrically conductive wire portions.

9. The splitter of claim 8, wherein the current return path is electrically grounded.

10. The splitter of claim 1, wherein the first electrically conductive wire portion is configured to electrostatically couple to the second electrically conductive wire portion without creating an electrical short circuit between the first electrically conductive wire portion and the second electrically conductive wire portion.

11. A signal splitter comprising:
a first output port;
a second output port;
a signal transmission path between the first output port and the second output port;
a first electrically conductive wire coupled to the signal transmission path; and
a second electrically conductive wire coupled to the signal transmission path,
wherein:
  the signal transmission path is configured to provide an amount of isolation between the first output port and the second output port;
  the first electrically conductive wire and the second electrically conductive wire are configured to electrostatically couple together so as to reduce the amount of isolation for signals having frequencies in a first frequency band in relation to signals having frequencies outside the first frequency band.

12. The signal splitter of claim 11, wherein the first electrically conductive wire and the second electrically conductive wire are twisted together.

13. The signal splitter of claim 11, wherein the first electrically conductive wire and the second electrically conductive wire are configured to electrostatically couple without any electrical short circuit connection between the first electrically conductive wire and the second electrically conductive wire.

14. The signal splitter of claim 11, further comprising a third electrically conductive wire portion configured to:
  electrically couple to a current return path; and
  electrostatically couple to both the first electrically conductive wire and the second electrically conductive wire.

15. The signal splitter of claim 14, wherein an end of the third electrically conductive wire is electrically grounded.

16. A signal splitter comprising:
a signal transmission path configured to conduct signals between a first output port and a second output port, and
a transmission line element configured to electrically couple to the signal transmission path, the transmission line element comprising a first electrical conductor and a second electrical conductor,
wherein:
  the signal transmission path includes a first inductor configured to electrically couple to the first output port,
  the signal transmission path includes a second inductor configured to electrically couple to the second output port,
  a first end of the first electrical conductor is configured to electrically couple to a node between the first inductor and the first output port, and
  a first end of the second electrical conductor is configured to electrically couple to a node between the second inductor and the second output port.

17. The signal splitter of claim 16, wherein the first electrical conductor and the second electrical conductor are configured to electrostatically couple.

18. The signal splitter of claim 16, wherein:
  the signal transmission path includes a resistor;
  the first inductor is positioned between the first output port and the resistor, and
  the second inductor is positioned between the second output port and the resistor.

19. The signal splitter of claim 16, wherein the coupled transmission line element further comprises a third electrical conductor configured to electrostatically couple to the first electrical conductor and the second electrical conductor.

* * * * *